United States Patent
Chang

(10) Patent No.: US 7,170,162 B2
(45) Date of Patent: Jan. 30, 2007

(54) CHIP EMBEDDED PACKAGE STRUCTURE

(75) Inventor: Wen-Yuan Chang, Hsin-Tien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/994,043

(22) Filed: Nov. 18, 2004

(65) Prior Publication Data

US 2005/0253244 A1     Nov. 17, 2005

(30) Foreign Application Priority Data

May 11, 2004   (TW) ............................... 93113134 A

(51) Int. Cl.
*H01L 23/12* (2006.01)
*H01L 23/053* (2006.01)

(52) U.S. Cl. ............... 257/700; 257/797; 257/E23.179; 257/E23.176; 257/E23.064

(58) Field of Classification Search ................. 257/797
See application file for complete search history.

(56) References Cited

U.S. PATENT DOCUMENTS

| | | | | |
|---|---|---|---|---|
| 3,868,724 A | * | 2/1975 | Perrino | 257/668 |
| 6,154,366 A | * | 11/2000 | Ma et al. | 361/704 |
| 6,166,433 A | * | 12/2000 | Takashima et al. | 257/702 |
| 6,475,877 B1 | * | 11/2002 | Saia et al. | 438/460 |
| 6,864,165 B1 | * | 3/2005 | Pogge et al. | 438/612 |
| 7,026,079 B2 | * | 4/2006 | Louwet et al. | 430/14 |
| 2002/0011650 A1 | * | 1/2002 | Nishizawa et al. | 257/666 |
| 2003/0043565 A1 | * | 3/2003 | Juang | 361/813 |
| 2003/0155908 A1 | * | 8/2003 | Ohazama | 324/158.1 |

\* cited by examiner

*Primary Examiner*—Minh Loan Tran
*Assistant Examiner*—Leslie Pilar Cruz
(74) *Attorney, Agent, or Firm*—J.C. Patents

(57) ABSTRACT

A chip embedded package structure is provided. A stiffener is disposed on a tape. The tape has at least an alignment mark and the stiffener has at least a chip opening. A chip having a plurality of bonding pads thereon is disposed on the tape within the chip opening such that the bonding pads face the tape. A plurality of through holes is formed in the tape to expose the bonding pads respectively. After that, an electrically conductive material is deposited to fill the through holes and form a plurality of conductive vias that connects with the bonding pads respectively. A multi-layered interconnection structure is formed on the surface of the tape away from the chip. The multi-layered interconnection structure has an inner circuit that connects to the conductive vias. The inner circuit has a plurality of metallic pads disposed on the outer surface of the multi-layered interconnection structure.

19 Claims, 6 Drawing Sheets

CHIP EMBEDDED PACKAGE STRUCTURE

CROSS-REFERENCE TO RELATED APPLICATION

This application claims the priority benefit of Taiwan application serial no. 93113134, filed on May 11, 2004.

BACKGROUND OF THE INVENTION

1. Field of the Invention

The present invention relates to a chip package structure. More particularly, the present invention relates to a chip embedded package structure.

2. Description of Related Art

In this electronic age, multi-functional, highly integrated, miniaturized, inexpensive devices with a high processing speed are in great demand. To meet this trend, chip packages are also highly miniaturized and densified. In the conventional ball grid array (BGA) packaging technique, a package substrate is often used as a carrier for an integrated circuit (IC) chip. The chip disposed over the package substrate is electrically connected to the substrate through flip chip bonding or wire bonding. An array of solder balls is also attached to the bottom surface of the package substrate. Hence, the chip is able to electrically connect with the electronic devices in another level such as a printed circuit board through an inner circuit within the package substrate and the solder balls at the bottom of the package substrate.

However, the BGA packaging technique needs to deploy a package substrate with a high layout density and electrically connect using either the flip chip or wire bonding technique. Hence, the signal transmission pathway is slightly longer. To reduce the transmission pathway, a chip embedded package structure having a bump-less build-up layer (BBUL) has been developed. In the chip embedded package, the step of connecting a chip to a package substrate through flip-chip or wire bonding is unnecessary. This is because a multi-layered interconnection structure is directly formed on the active surface of the chip and an array of contacts such as solder balls or pins for connecting with higher level electronic devices is directly formed on the multi-layered interconnection structure thereafter.

FIGS. 1A through 1F are schematic cross-sectional views showing the steps for forming a conventional chip package. First, as shown in FIG. 1A, a tape 110 and a stiffener 120 are provided. The stiffener 120 is attached to the tape 110 for increasing the structural strength and heat dissipating capability of the subsequently formed package. The stiffener 120 has a chip opening 122 for accommodating a chip 130 (shown in FIG. 1B) and the tape 110 covers the bottom end of the chip opening 122.

As shown in FIGS. 1B and 1C, a chip 130 having a plurality of bonding pads 134 on an active surface 132 is attached to the tape 110 within the chip opening 122. Thereafter, an encapsulating compound 140 is deposited to fill the chip opening 122 between the chip 130 and the stiffener 120. The tape 110 serves as a means of positioning and supporting the chip 130 inside the chip opening 122 before the chip 130 is properly fixed by the encapsulating compound 140. After fixing the position of the chip 130, the tape 110 is torn away and cleaned to ensure no residual tape remains.

As shown in FIG. 1D, a build-up process is performed to produce a multi-layered interconnection structure 150 on the active surface 132 of the chip 130 and the surface of the stiffener 120. The multi-layered interconnection structure 150 comprises a plurality of patterned circuit layers 152, at least a dielectric layer 154 and a plurality of conductive blind vias 156. The circuit layers 152 are sequentially stacked over the active surface 132 of the chip 130 and the surface of the stiffener 120 and connected to the bonding pads 134 of the chip 130. Each dielectric layer 154 is disposed between two neighboring circuit layers 152. Furthermore, the conductive blind vias 156 pass through one of the dielectric layer 154 and at least electrically connect two circuit layers 152 together. The circuit layers 152 and the conductive blind vias 156 together form an inner circuit 158. The inner circuit 158 also has a plurality of metallic pads 159 exposed on the outer surface of the multi-layered interconnection structure 150.

As shown in FIG. 1E, a solder mask layer 160 is formed over the multi-layered interconnection structure 150. The solder mask layer 160 has a plurality of openings 162 that exposes the metallic pads 159 respectively.

As shown in FIG. 1F, a layer of pre-soldering material is printed over the openings 162 of the solder mask layer 160. Thereafter, a plurality of conductive pins 180 is bonded to the pre-soldering material 170 to form a complete chip package structure 100.

The aforementioned process of forming the package has the following drawbacks. The tape needs to be torn away and the surface needs to be cleaned so that the process is complicated but trivial. Moreover, after tearing the tape away from the chip and the stiffener, coplanarity between the chip and the stiffener is hard to maintain. Ultimately, this may reduce the reliability of the subsequently formed multi-layered interconnection structure. In addition, no alignment marks are set up for performing laser drilling or photolithographic process during the fabrication of the multi-layered interconnection structure. Without any alignment mark to enhance processing accuracy, it is difficult to increase the overall yield of the packaging.

SUMMARY OF THE INVENTION

Accordingly, the present invention is directed to a chip embedded package structure capable of shortening the processing time, increasing positional accuracy, improving structural coplanarity and package reliability, and yield of the packaging.

The present invention is directed to a chip embedded package structure comprising a tape, a stiffener, at least a chip and a multi-layered interconnection structure. The tape comprises at least a first alignment mark located on the surface. The tape also comprises a plurality of conductive vias disposed inside passing through the tape. The stiffener is disposed on the tape and comprises at least a chip opening. The chip comprises an active surface having a plurality of bonding pads formed thereon. The chip is disposed on the tape inside the chip opening such that the active surface of the chip faces the tape. The bonding pads are electrically connected to the conductive vias respectively. The multi-layer interconnection structure is disposed on the tape away from the chip. The multi-layer interconnection structure comprises an inner circuit connected to the conductive vias. Furthermore, the inner circuit comprises a plurality of metallic pads on the outer surface of the inter-layer interconnection structure away from the tape.

In brief, alignment marks are pre-fabricated on the tape in the present embodiment of the present invention so that the alignment marks can be used to attach the chip, form the conductive vias and fabricate the multi-layered interconnection structure. Furthermore, there is no need to remove the tape throughout the packaging process. Consequently, the processing time of the package is reduced, the positioning accuracy and yield are increased and the structural coplanarity and reliability of the package are improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
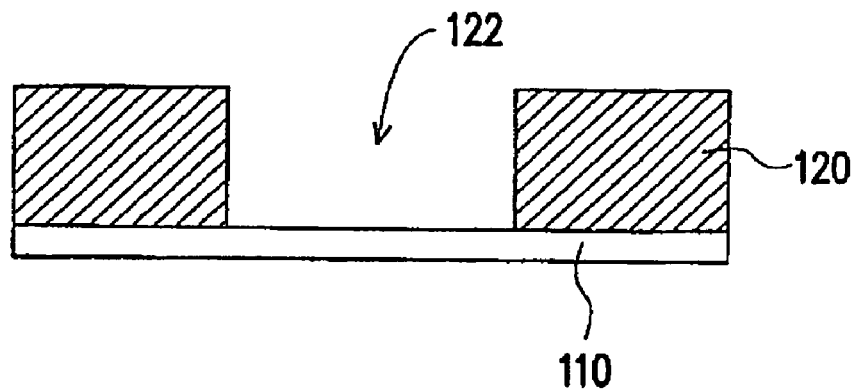
FIGS. 1A through 1F are schematic cross-sectional views showing the steps of forming a conventional chip package.
Figure 1B:
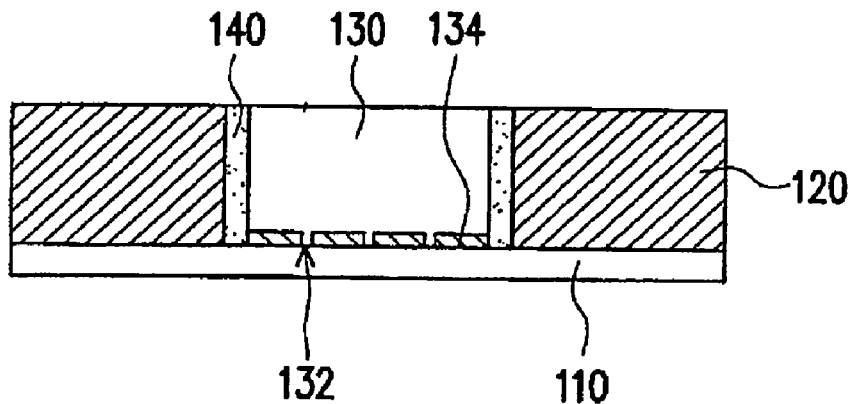
Figure 1C:
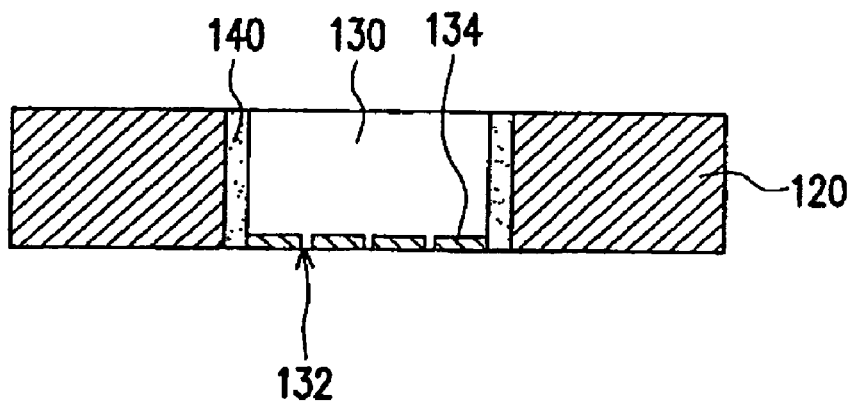
Figure 1D:
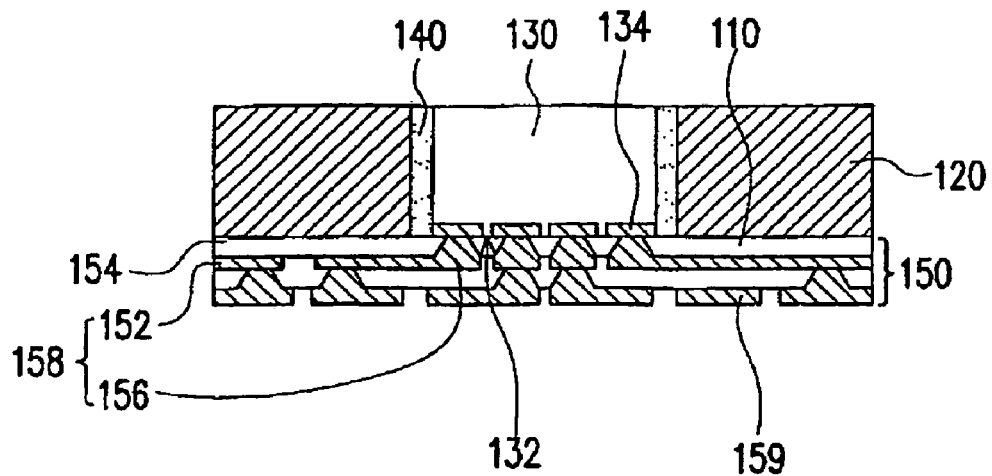
Figure 1E:
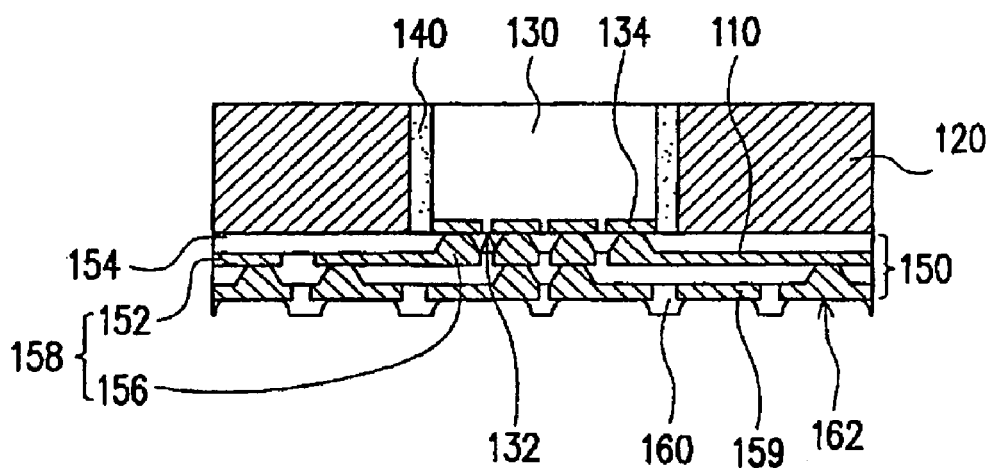
Figure 1F:
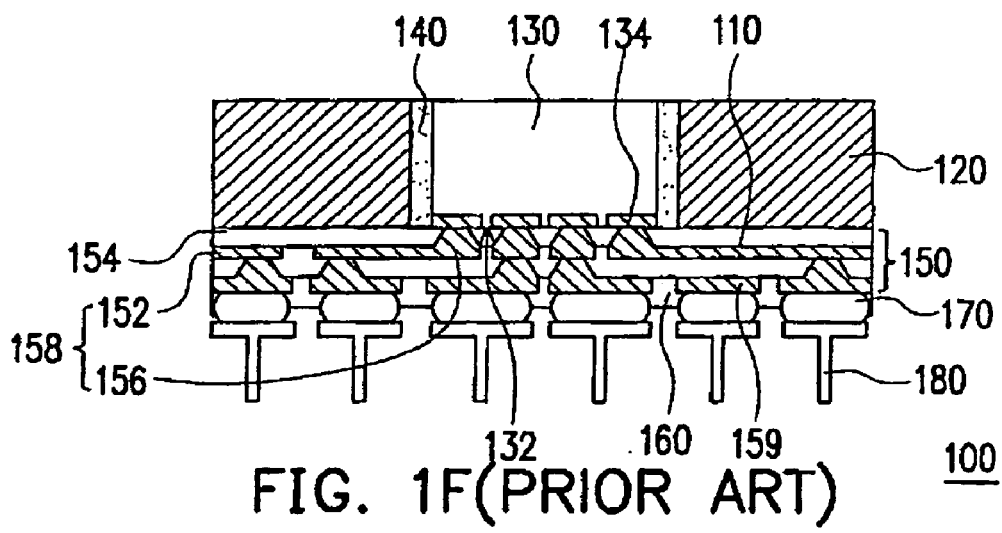

Reference will now be made in detail to the present preferred embodiments of the invention, examples of which are illustrated in the accompanying drawings. Wherever possible, the same reference numbers are used in the drawings and the description to refer to the same or like parts.

Figure 2A:
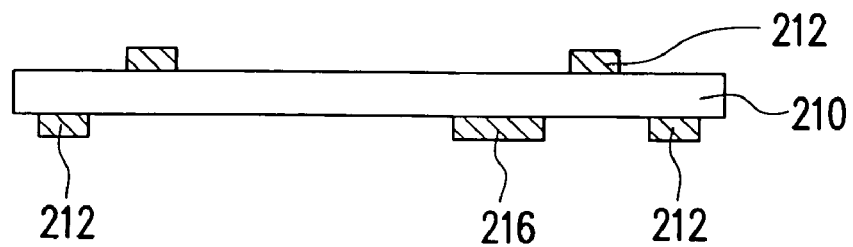
FIGS. 2A through 2G are schematic cross-sectional views showing the steps of fabricating a chip embedded package structure according to one embodiment of the present invention.

FIGS. 2A through 2G are schematic cross-sectional views showing the steps of fabricating a chip embedded package structure according to one embodiment of the present invention. First, as shown in FIG. 2A, a tape 210 is provided. The tape 210 is a polyimide (PI) tape, for example. The tape 210 comprises at least an alignment mark 212 (four alignment marks in the illustration) on the surface of the tape 210. These alignment marks 212 are not limited to any one side of the tape 210. In general, the alignment marks 212 can be disposed on both sides of the tape 210.

Figure 2B:
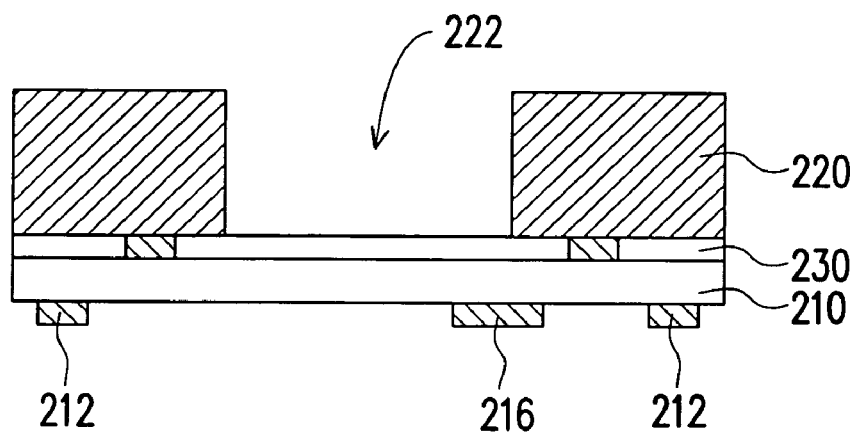
Figure 2C:
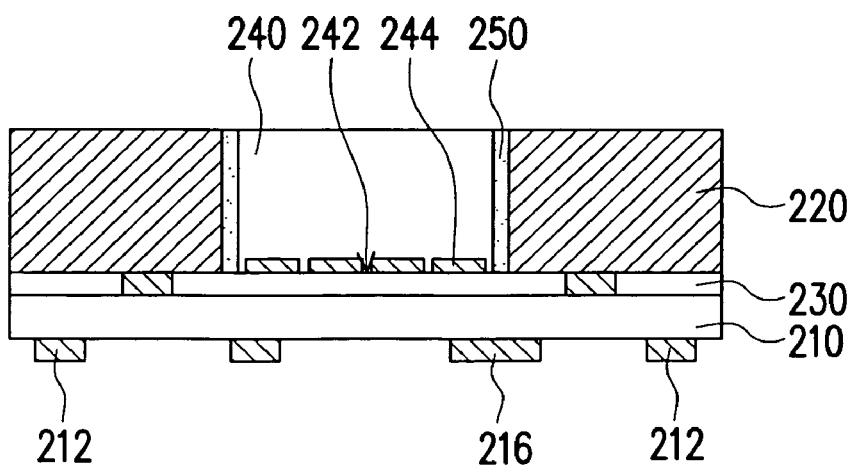
Figure 2D:
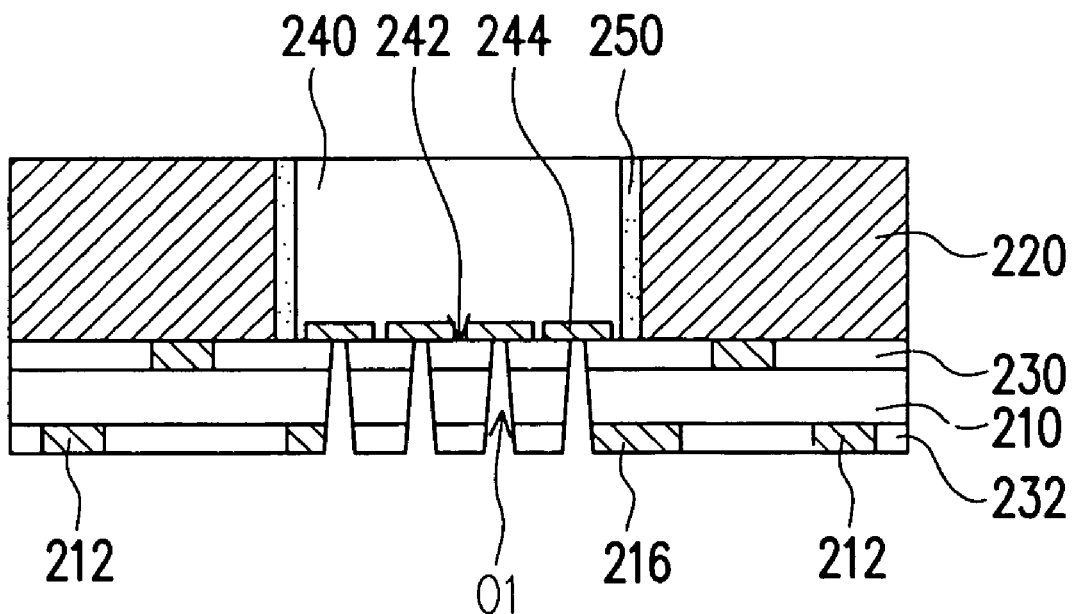
Figure 2E:
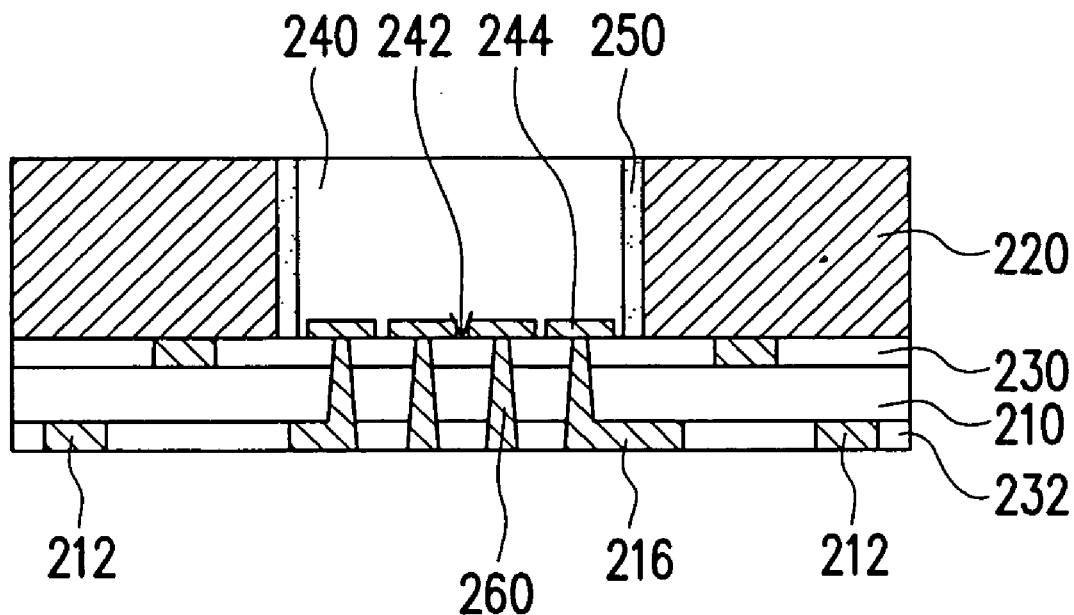
Figure 2F:
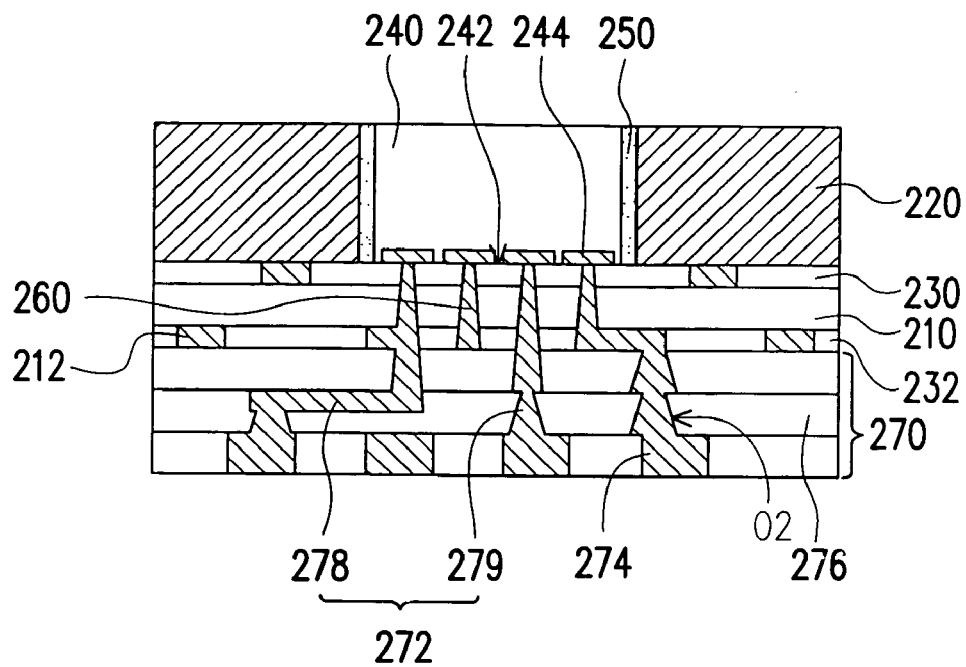

The tape 210 may further comprise a circuit layer 216 disposed on a surface that will not come in contact with a subsequently attached chip 240 as shown in FIG. 2C for a redistribution of the connections between conductive vias 260 and an inner circuit 272 as shown in FIG. 2F. The alignment mark 212 is formed, for example, by depositing a material over the tape 210 to form a material layer (not shown) and performing photolithographic and etching processes to pattern the material layer. The material layer is fabricated using a metal or other material that can be easily identified by a processing equipment. It should be noted that the alignment marks 212 and the circuit layer 216 could be fabricated together as a conductive pattern (unlabeled). The conductive pattern is formed, for example, by performing photolithographic and etching processes.

As shown in FIG. 2B, a stiffener 220 having at least a chip opening 222 is attached to the tape 210. The stiffener 220 needs to have sufficient mechanical strength and heat-dissipating capability for protecting the subsequently formed chip 240. The stiffener 220 and the tape 210 are bonded together using an adhesive layer 230, for example. Meanwhile, the circuit layer 216 is located on the surface of the tape 210 away from the stiffener 220.

As shown in FIG. 2C, a chip 240 is attached to the tape 210 inside the chip opening 222 of the stiffener 220. The chip 240 comprises an active surface 242 with a plurality of bonding pads 244 formed thereon. The active surface 242 of the chip 240 is attached to the tape 210. The chip 240 is bonded to the tape 210 through the adhesive layer 230, for example. When the chip 240 is bonded to the tape 210 through the adhesive layer 230, the alignment marks 212 can be used as a reference for accurately positioning the chip 240 inside the chip opening 222. After positioning the chip 240 inside the chip opening 222, an encapsulating compound 250 is deposited to fill the remaining chip opening 222 between the chip 240 and the stiffener 220. Hence, the location of the chip 240 is firmly fixed within the chip opening 222 so that relative shifting between the chip 240, the stiffener 220 and the tape 210 is minimized. With the chip 240 fixed in position, the alignment mark 212 on the tape 210 instead of the chip 240 can be used as a reference. Furthermore, a curing process can be carried out after filling the chip opening 222 with the encapsulating compound 250.

As shown in FIG. 2D, a plurality of through holes O1 are formed in the tape 210 by laser drilling, for example. The through holes O1 pass through the tape 210 and the adhesive layer 230 to expose the bonding pads 244, respectively. When the through holes O1 are formed by laser drilling, the alignment marks 212 on the surface of the tape 210 away from the chip 240 can be used as a reference directly or indirectly through the transparent tape 210 from the side close to the chip 240. Furthermore, an adhesive layer 232 may also form on the surface of the tape 210 away from the stiffener 220 before drilling the through holes O1 so that the through holes O1 also pass through the adhesive layer 232.

As shown in FIG. 2E, a conductive material is deposited into the through holes O1 to form a plurality of conductive vias 260. Each conductive via 260 connects with a bonding pad 244. Furthermore, some of the conductive vias 260 also connect with the circuit layer 216 so that the conductive vias 260 can extend to an area outside the active surface 242 of the chip 240.

As shown in FIG. 2F, a multi-layered interconnection structure 270 is formed on the tape 210 on the opposite side of the chip 240. The multi-layered interconnection structure 270 comprises a plurality of dielectric layers 276, a plurality of circuit layers 278 and a plurality of conductive vias 279. The dielectric layers 276 and the circuit layers 278 are stacked alternately over each other. The conductive vias 279 pass through the dielectric layer 276 for electrically connecting two neighboring circuit layers 278 or electrically connecting the conductive vias 260 in the tape 210 and the circuit layer 278 closest to the tape 210. The circuit layers 278 and the conductive vias 279 together form an inner circuit 272 within the multi-layered interconnection structure 270. The circuit layer 278 of the inner circuit 272 furthest from the tape 210 may have a plurality of exposed metallic pads 274. Typically, the multi-layered interconnection structure 270 is formed on the tape 210 by a build-up process. The conductive vias 279 for linking neighboring circuit layers 278 are formed inside laser-drilled openings O2 in the dielectric layer 276, for example.

Figure 2G:
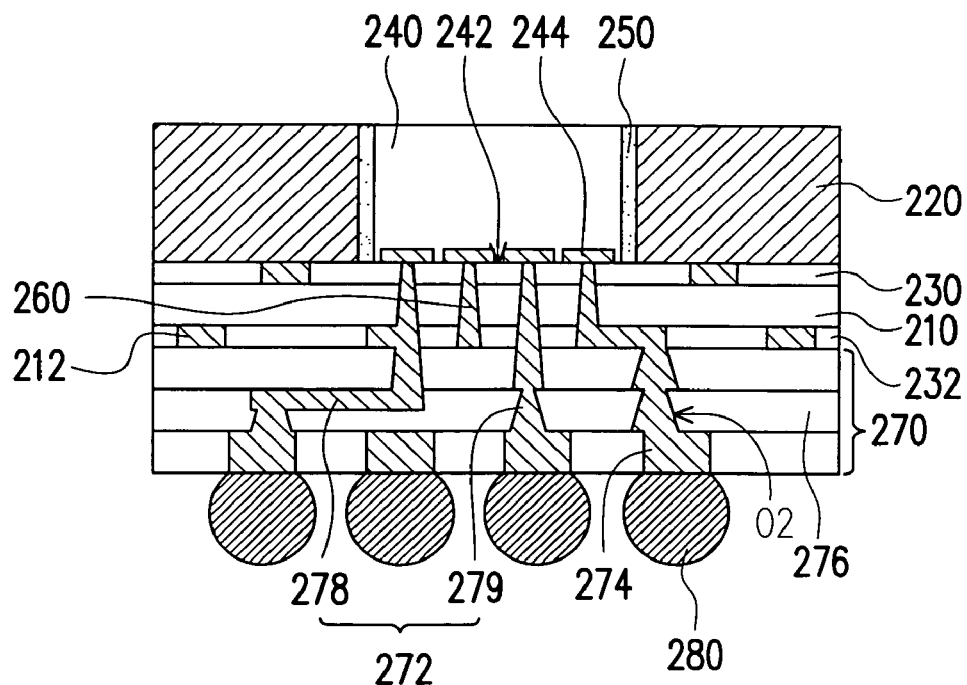

As shown in FIG. 2G, a conductive ball 280 or a conductive pin is formed on each metallic pad 274. Here, a conductive ball is used as an example. The conductive balls 280 serve as a final link in the electrical pathway from the bonding pads 244 on the chip 240 through the conductive vias 260, the inner circuit 272 and the metallic pads 274 to external devices. In addition, some of the electrical signals from the bonding pads 244 may pass through the circuit layer 216 on the way to the metallic pads 274.

As shown in FIG. 2G, some of the alignment marks 212 are located under the chip opening 222 so that the positioning system of a processing equipment may detect the alignment marks 212 as a reference to accurately position the chip 240 within the chip opening 222. Furthermore, in the chip embedded packaging process, a tape 210 visible to the positioning system of the processing equipment may be deployed. Hence, the equipment may see through the tape 210 to detect the alignment mark 212 on the other side of the tape 210 and use the alignment mark 212 as a reference for positioning thereafter. In other words, the alignment marks 212 are no longer restricted to any one side of the tape 210 such as close to the chip 240 or away from the chip 240. In addition, the chip 240 or the laser-drilled holes can be accurately positioned by referencing the alignment marks 212.

Figure 3:
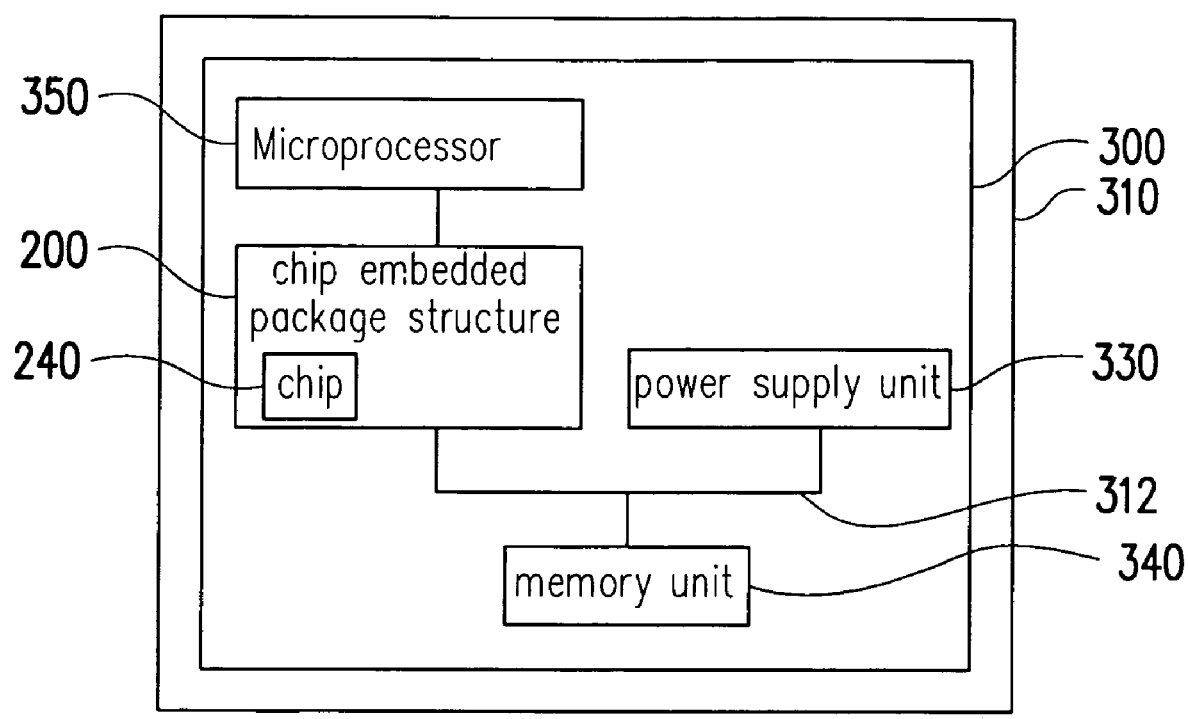
FIG. 3 is a block diagram of an electronic system according to one embodiment of the present invention.

FIG. 3 is a block diagram of an electronic system according to one embodiment of the present invention. As shown in FIG. 3, the electronic system 300 may be a computer system or a communication system. In general, the electronic system 300 is used inside a personal computer or a mobile communication device, for example. The mobile communication device includes a mobile phone or a personal digital assistant with mobile communication function. The electronic system 300 is disposed on a circuit board 310 comprising a bus 312, a memory unit 340 and a chip embedded package structure 200. The memory unit 340 and the bus 312 are electrically connected. Similarly, the chip embedded package structure 200 and the bus 312 are electrically connected. The composition of the chip embedded package structure 200 is identical to the chip embedded package structure in the aforementioned embodiment.

In addition, the electronic system 300 further comprises a power supply unit 330 disposed on the circuit board 310. The chip 240 within the chip embedded package structure 200 is a microprocessor, for example. Alternatively, the electronic system 300 may include an external microprocessor 350, for example.

In summary, the alignment marks are formed on the tape in the present invention. Furthermore, there is no need to remove the tape throughout the process. Therefore, the alignment marks on the tape can be used to form the laser-drilled through holes in the tape, the laser-drilled or photolithographic-processed openings in the dielectric layer of the multi-layered interconnection structure or position the chip inside the chip opening with great accuracy. Because the alignment marks on the tape greatly improves the positional accuracy of various processing steps, a lot of chips can be packaged at the same time so that the processing time of the packages is reduced. Furthermore, in the presence of the tape, the package can have a better structural coplanarity and a higher reliability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip embedded package structure, comprising:
a tape, having at least a first alignment mark disposed on a surface of the tape and at least a second alignment mark disposed on another surface of the tape, wherein the tape comprises a plurality of conductive vias passing through the tape;
a stiffener, disposed on the tape, wherein the stiffener comprises at least a chip opening;
at least a chip, disposed on the surface of the tape and inside the chip opening such that an active surface of the chip faces the tape, wherein the first alignment mark is disposed on the surface of the tape on the same side as the chip, the second alignment mark is disposed on the surface of the tape away from the chip, the chip also comprises a plurality of bonding pads disposed on the active surface, and the bonding pads are electrically connected to the conductive vias respectively; and
a multi-layered interconnection structure, disposed on the surface of the tape away from the chip, wherein the multi-layered interconnection structure comprises an inner circuit connecting with the conductive vias and comprises a plurality of metallic pads on a surface of the multi-layered interconnection structure away from the tape.

2. The chip embedded package structure of claim 1, wherein the first alignment mark is located under the chip opening.

3. The chip embedded package structure of claim 1, wherein the tape is fabricated using a transparent material.

4. The chip embedded package structure of claim 1, wherein the tape further comprises a circuit layer disposed on the surface of the tape away from the chip and connected to the conductive vias and the inner circuit.

5. The chip embedded package structure of claim 1, wherein the package further comprises a plurality of conductive balls disposed on the metallic pads respectively.

6. The chip embedded package structure of claim 1, wherein the package further comprises a plurality of conductive pins disposed on the metallic pads respectively.

7. The chip embedded package structure of claim 1, wherein the package further comprises an encapsulating compound disposed inside the chip opening between the chip and the stiffener.

8. An electronic system for disposing on a circuit board, comprising:
a bus;
a memory unit, connected to the bus;
a chip embedded package structure, connected to the bus, wherein the chip embedded package structure further comprises:
a tape, having at least a first alignment mark disposed on a surface of the tape and at least a second alignment mark disposed on another surface of the tape, wherein the tape comprises a plurality of conductive vias passing through the tape;
at least a stiffener, disposed on the tape, wherein the stiffener comprises at least a chip opening;
a chip, disposed on the surface of the tape and inside the chip opening such that an active surface of the chip faces the tape, wherein the first alignment mark is disposed on the surface of the tape on the same side as the chip, the second alignment mark is disposed on the surface of the tape away from the chip, the chip also comprises a plurality of bonding pads disposed on the active surface, and the bonding pads are electrically connected to the conductive vias respectively; and
a multi-layered interconnection structure, disposed on the surface of the tape away from the chip, wherein the multi-layered interconnection structure comprises an inner circuit that connects with the conductive vias and comprises a plurality of metallic pads on a surface of the multi-layered interconnection structure away from the tape.

9. The electronic system of claim 8, wherein the first alignment mark is disposed under the chip opening.

10. The electronic system of claim 8, wherein the tape is fabricated using a transparent material.

11. The electronic system of claim 8, wherein the tape further comprises a circuit layer disposed on the surface of the tape away from the chip and connected to the conductive vias and the inner circuit.

12. The electronic system of claim 8, wherein the chip embedded package structure further comprises a plurality of conductive balls disposed on the metallic pads respectively.

13. The electronic system of claim 8, wherein the chip embedded package structure further comprises a plurality of conductive pins disposed on the metallic pads respectively.

14. The electronic system of claim 8, wherein the chip embedded package structure further comprises an encapsulating compound disposed within the chip opening between the chip and the stiffener.

15. The electronic system of claim 8, wherein the system further comprises at least a power supply unit that connects with the bus.

16. The electronic system of claim 8, wherein the system further comprises a microprocessor connected to the bus.

17. The electronic system of claim 8, wherein the chip is a microprocessor.

18. The electronic system of claim 8, wherein the electronic system is a computer system.

19. The electronic system of claim 8, wherein the electronic system is a communication chip system.

* * * * *